(12) United States Patent
Zellers et al.

(10) Patent No.: US 11,714,489 B2
(45) Date of Patent: Aug. 1, 2023

(54) THIN PROFILE USER INTERFACE DEVICE AND METHOD PROVIDING LOCALIZED HAPTIC RESPONSE

(71) Applicant: KEMET Electronics Corporation, Fort Lauderdale, FL (US)

(72) Inventors: Brian C Zellers, Bellefonte, PA (US); Li Jiang, Union City, CA (US); Christophe Ramstein, San Francisco, CA (US); Stephen Davis, State College, PA (US)

(73) Assignee: Kemet Electronics Corporation, Fort Lauderdale, FL (US)

( * ) Notice: Subject to any disclaimer, the term of this patent is extended or adjusted under 35 U.S.C. 154(b) by 101 days.

(21) Appl. No.: 16/139,756

(22) Filed: Sep. 24, 2018

(65) Prior Publication Data

US 2019/0025925 A1    Jan. 24, 2019
US 2020/0257363 A9    Aug. 13, 2020

Related U.S. Application Data

(63) Continuation of application No. 13/735,804, filed on Jan. 7, 2013, now Pat. No. 10,088,936.

(51) Int. Cl.
  *G06F 3/01*  (2006.01)
  *G06F 3/02*  (2006.01)
  (Continued)

(52) U.S. Cl.
  CPC ............ *G06F 3/016* (2013.01); *G06F 1/1626* (2013.01); *G06F 1/1632* (2013.01);
  (Continued)

(58) Field of Classification Search
  CPC ...... G06F 3/0202; G06F 3/0219; G06F 3/016; G06F 3/021; G06F 3/0221; G06F 3/0414
  See application file for complete search history.

(56) References Cited

U.S. PATENT DOCUMENTS 4,066,851 A    1/1978  White
5,350,966 A    9/1994  Culp
(Continued)

FOREIGN PATENT DOCUMENTS

KR    10-2012-0063318    6/2012

OTHER PUBLICATIONS

U.S. Notice of Allowance issued in U.S. Appl. No. 13/735,804 dated May 18, 2018.
(Continued)

*Primary Examiner* — Matthew A Eason
*Assistant Examiner* — Scott D Au
(74) *Attorney, Agent, or Firm* — Hogan Lovells US LLP

(57) ABSTRACT

Electromechanical polymer (EMP) actuators are used to create haptic effects on a user interface deface, such as a keyboard. The keys of the keyboard may be embossed in a top layer to provide better key definition and to house the EMP actuator. Specifically, an EMP actuator is housed inside an embossed graphic layer that covers a key of the keyboard. Such a keyboard has a significant user interface value. For example, the embossed key provides the tactile effect of the presence of a key with edges, while allowing for the localized control of haptic vibrations. For such applications, an EMP transducer provides high strains, vibrations or both under control of an electric field. Furthermore, the EMP transducer can generate strong vibrations. When the frequency of the vibrations falls within the acoustic range, the EMP transducer can generate audible sound, thereby functioning as an audio speaker.

20 Claims, 5 Drawing Sheets

(51) Int. Cl.
*G06F 1/16* (2006.01)
*H01H 13/85* (2006.01)
*H01H 3/00* (2006.01)
*H10N 30/857* (2023.01)

(52) U.S. Cl.
CPC ........... *G06F 3/0202* (2013.01); *H01H 13/85* (2013.01); *G06F 2200/1633* (2013.01); *H01H 2003/008* (2013.01); *H01H 2215/05* (2013.01); *H10N 30/857* (2023.02)

(56) References Cited

U.S. PATENT DOCUMENTS

| | | | |
|---|---|---|---|
| 5,682,689 | A | 11/1997 | Walker |
| 6,687,325 | B1 | 2/2004 | Wells |
| 6,809,462 | B2 | 10/2004 | Pelrine |
| 7,038,357 | B2 | 5/2006 | Goldenberg et al. |
| 7,339,572 | B2 | 3/2008 | Schena |
| 7,944,735 | B2 | 5/2011 | Bertin |
| 8,222,799 | B2 | 7/2012 | Polyakov et al. |
| 8,362,882 | B2 | 1/2013 | Heubel et al. |
| 8,427,441 | B2 | 4/2013 | Paleczny |
| 8,434,748 | B1 | 5/2013 | Pearce |
| 8,746,397 | B2 | 6/2014 | Peskar |
| 9,053,617 | B2 * | 6/2015 | Ramstein ............... G08B 6/00 |
| 9,164,586 | B2 | 10/2015 | Zellers et al. |
| 9,170,650 | B2 | 10/2015 | Ramstein et al. |
| 10,088,936 | B2 | 10/2018 | Zellers et al. |
| 2004/0095326 | A1 * | 5/2004 | Anderson ............. G06F 3/0202 345/168 |
| 2005/0040733 | A1 | 2/2005 | Goldenberg |
| 2005/0273910 | A1 | 12/2005 | Cozens |
| 2007/0146317 | A1 | 6/2007 | Schena |
| 2007/0152974 | A1 | 7/2007 | Kim |
| 2007/0165009 | A1 | 7/2007 | Sakurai |
| 2007/0200467 | A1 | 8/2007 | Heydt et al. |
| 2008/0030485 | A1 | 2/2008 | Endo |
| 2008/0284277 | A1 | 11/2008 | Kwon |
| 2009/0001855 | A1 | 1/2009 | Lipton |
| 2009/0002205 | A1 | 1/2009 | Klinghult et al. |
| 2009/0002328 | A1 | 1/2009 | Ullrich |
| 2010/0079264 | A1 | 4/2010 | Hoellwarth |
| 2011/0038625 | A1 | 2/2011 | Zellers et al. |
| 2011/0290686 | A1 | 12/2011 | Huang |
| 2012/0017703 | A1 | 1/2012 | Ikebe |
| 2012/0105333 | A1 | 5/2012 | Maschmeyer et al. |
| 2012/0121944 | A1 | 5/2012 | Yamamoto |
| 2012/0126683 | A1 | 5/2012 | Jenninger et al. |
| 2012/0126959 | A1 | 5/2012 | Zarrabi |
| 2012/0139393 | A1 | 6/2012 | Choi |
| 2012/0178880 | A1 | 7/2012 | Zhang et al. |
| 2012/0194448 | A1 | 8/2012 | Rothkopf |
| 2012/0206248 | A1 | 8/2012 | Biggs |
| 2012/0223880 | A1 | 9/2012 | Birnbaum |
| 2013/0141716 | A1 * | 6/2013 | Mizushima ............ G01N 21/13 356/244 |
| 2014/0139328 | A1 | 5/2014 | Zellers et al. |
| 2014/0139329 | A1 | 5/2014 | Ramstein et al. |
| 2014/0139436 | A1 | 5/2014 | Ramstein et al. |
| 2014/0140551 | A1 | 6/2014 | Ramstein et al. |
| 2014/0191973 | A1 | 7/2014 | Zellers et al. |
| 2016/0358725 | A1 * | 12/2016 | Liao ....................... H01H 13/85 |

OTHER PUBLICATIONS

U.S. Non-Final Office Action issued in U.S. Appl. No. 13/735,804 dated Aug. 10, 2017.
U.S. Final Office Action issued in U.S. Appl. No. 13/735,804 dated Feb. 23, 2017.
U.S. Non-Final Office Action issued in U.S. Appl. No. 13/735,804 dated Aug. 11, 2016.
U.S. Final Office Action issued in U.S. Appl. No. 13/735,804 dated Apr. 19, 2016.
U.S. Non-Final Office Action issued in U.S. Appl. No. 13/735,804 dated Oct. 1, 2015.
U.S. Final Office Action issued in U.S. Appl. No. 13/735,804 dated Feb. 13, 2015.
U.S. Non-Final Office Action issued in U.S. Appl. No. 13/735,804 dated Jul. 31, 2014.
International Preliminary Report on Patentability dated Jul. 7, 2015 issued in PCT publication No. WO2014/114979.
International Search Report and Written Report dated Oct. 15, 2014 issued in PCT publication No. WO2014/114979.
U.S. Notice of Allowance issued in U.S. Appl. No. 13/683,980 dated Jul. 13, 2015.
U.S. Notice of Allowance issued in U.S. Appl. No. 13/683,980 dated Apr. 24, 2015.
U.S. Final Office Action issued in U.S. Appl. No. 13/683,980 dated Oct. 10, 2014.
U.S. Non-Final Office Action issued in U.S. Appl. No. 13/683,980 dated May 7, 2014.
International Preliminary Report on Patentability dated May 26, 2015 issued in PCT publication No. WO2014/081873.
International Search Report and Written Report dated Mar. 28, 2014 issued in PCT publication No. WO2014/081873.
U.S. Notice of Allowance issued in U.S. Appl. No. 13/683,928 dated Aug. 21, 2015.
U.S. Final Office Action issued in U.S. Appl. No. 13/683,928 dated Mar. 26, 2015.
U.S. Non-Final Office Action issued in U.S. Appl. No. 13/683,928 dated Aug. 29, 2014.
International Preliminary Report on Patentability dated May 26, 2015 issued in PCT publication No. WO2014/081871.
International Search Report and Written Report dated May 21, 2015 issued in PCT publication No. WO2014/081871.

* cited by examiner

THIN PROFILE USER INTERFACE DEVICE AND METHOD PROVIDING LOCALIZED HAPTIC RESPONSE

CROSS REFERENCE TO RELATED APPLICATIONS

This application is a continuation application of U.S. Non-Provisional application Ser. No. 13/735,804 filed Jan. 7, 2013, entitled "Thin Profile User Interface Device and Method Providing Localized Haptic Response," and PCT Application Serial No. PCT/US13/71062 filed Feb. 12, 2014, which are incorporated herein by reference in their entirety for all purposes.

The present patent application is related to U.S. Provisional Patent Application Ser. No. 61/679,641, filed Aug. 3, 2012, entitled "Electromechanical Polymer Actuators for Haptic Feedback," and U.S. Patent applications (i) Ser. No. 13/683,980, entitled "Haptic System with Localized Response," filed Nov. 21, 2012, and (ii) Ser. No. 13/683,928, entitled "EMP Actuators for Deformable Surface and Keyboard Application," also filed on Nov. 21, 2012. The disclosures of the Provisional Application and the Applications are hereby incorporated by reference in its entirety.

BACKGROUND OF THE INVENTION

1. Field of the Invention

The present invention relates to using transducers based on electromechanical polymers (EMP) layers; in particular, the present invention relates to use of such transducers to provide haptic response in keys of a thin profile keyboard.

2. Discussion of the Related Art

Transducers are devices that transform one form of energy to another form of energy. For example, a piezoelectric transducer transforms mechanical pressure into an electrical voltage. Thus, a user may use the piezoelectric transducer as a sensor of the mechanical pressure by measuring the output electrical voltage. Alternatively, some smart materials (e.g., piezoceramics and dielectric elastomers (DEAP)) deform proportionally in response to an electric field. An actuator may therefore be formed out of a transducer based on such a smart material. Actuation devices based on these smart materials do not require conventional gears, motors, and cables to enable precise articulation and control. These materials also have the advantage of being able to exactly replicate both the frequency and the magnitude of the input waveform in the output response, with switching time in the millisecond range.

For a smart material that has an elastic modulus Y, thickness t, width w, and electromechanical response (strain in plane direction) $S_l$, the output vibration energy UV is given by the equation:

$$UV = \frac{1}{2} Y t w S_l^2 \tag{1}$$

DEAP elastomers are generally soft, having elastic moduli of about 1 MPa. Thus, a freestanding, high-quality DEAP film that is 20 micrometers (μm) thick or less is difficult to make. Also, a DEAP film provides a reasonable electromechanical response only when an electric field of 50 MV/m (V/μm) or greater is applied. Thus, a DEAP type actuator typically requires a driving voltage of 1,000 volts or more. Similarly, a DEAP type sensor typically requires a charging voltage of 1,000 volts or more. In a handheld consumer electronic device, whether as a sensor or as an actuator, such a high voltage poses safety and cost concerns. Furthermore, a DEAP elastomer has a low elastic modulus. As a result, to achieve the strong electrical signal output needed for a handheld device application requires too thick a film. The article, "Combined Driving Sensing Circuitry for Dielectric Elastomer Actuators in Mobile Applications," by M. Matsek et al., published in *Electroactive Polymer Actuators and Devices (EAPAD)* 2011, Proc. Of SPIE vol. 7975, 797612, discloses providing sensor functions in dielectric elastomer stack actuators (DESA). U.S. Pat. No. 8,222,799 to Polyakov, entitled "Surface Deformation Electroactive Polymer Transducers," also discloses sensor functions in dielectric elastomers.

Unlike a DEAP elastomer, a piezoceramic material can provide the required force output under low electric voltage. Piezoelectric materials are crystalline materials that become electrically charged under mechanical stress. Converse to the piezoelectric effect is dimensional change as a result of imposition of an electric field. In certain piezoelectric materials, such as lead zirconate titanate (PZT), the electric field-induced dimensional change can be up to 0.1%. Such piezoelectric effect occurs only in certain crystalline materials having a special type of crystal symmetry. For example, of the thirty-two classes of crystals, twenty-one classes are non-centrosymmetric (i.e., not having a center of symmetry), and of these twenty-one classes, twenty classes exhibit direct piezoelectricity. Examples of piezoelectric materials include quartz, certain ceramic materials, biological matter such as bone, DNA and various proteins, polymers such as polyvinylidene fluoride (PVDF) and polyvinylidene fluoride-co-trifluoroethylene [P(VDF-TrFE)]. For further information, see, for example, the article "Piezoelectric Transducer Materials", by H. JAFFE and D. A. BERLINCOURT, published on pages 1372-1386 of PROCEEDINGS OF THE IEEE, VOL. 53, No. 10, October, 1965.

The strain of a piezoelectric device is linearly proportional to the applied electric field E:

$$S_l \propto E \tag{2}$$

As illustrated in equation (2), when used in an actuator device, a piezoelectric material generates a negative strain (i.e., shortens) under a negative polarity electric field, and a positive strain (i.e., elongates) under a positive electric field. However, piezoceramic materials are generally too brittle to withstand a shock load, such as that encountered when the device is dropped.

Piezoceramics and dielectric elastomers change capacitance in response to a mechanical deformation, and thus may be used as pressure sensors. However, as mentioned above, DEAP elastomers are generally soft, having elastic moduli of about 1 MPa. Thus, a freestanding, high-quality DEAP film that is 20 micrometers (μm) thick or less is difficult to make.

Unlike the piezoelectric materials that require a special type of crystal symmetry, some materials exhibit electrostrictive behavior, such as found in both amorphous (non-crystalline) and crystalline materials. "Electrostrictive" or "electrostrictor" refers to a strain behavior of a material under an electric field that is quadratically proportional to the electric field, as defined in equation (3)

$$S_l \sim E^2 \tag{3}$$

Therefore, in contrast to a piezoelectric material, an electrostrictive actuator always generates positive strain, even under a negative polarity electric field (i.e., the electrostrictive actuator only elongates in the direction perpendicular to the imposed field), with an amplitude that is determined by the magnitude of the electric field and regardless of the polarity of the electric field. A description of some electrostrictive materials and their behavior may be found, for example, in the articles (a) "Giant Electrostriction and relaxor ferroelectric behavior in electron-irradiated poly (vinylidene fluoride-trifluoroethylene) copolymer", by Q. M. Zhang, et al, published in Science 280:2101 (1998); (b) "High electromechanical responses in terpolymer of poly (vinylidene fluoride-trifluoroethylene-chlorofluoroethylene)", by F. Xia et al, published in Advanced Materials, 14:1574 (2002). These materials are based on electromechanical polymers. Some further examples of EMPs are described, for example, in U.S. Pat. Nos. 6,423,412, 6,605, 246, and 6,787,238. Other examples include the EMPs whose compositions disclosed in pending U.S. patent application Ser. No. 13/384,196, filed on Jul. 15, 2009, and the EMPs which are blends of the P(VDF-TrFE) copolymer with the EMPs disclosed in the aforementioned U.S. Patents.

To achieve a substantially linear response and mechanical strains of, say, up to four (4) percent, in a longitudinal or transverse direction, the electrorestrictive EMPs discussed above requires an electric field intensity between 50 to 100 MV/m. In the prior art, to provide adequate mechanical strength and flexibility, the polymer films are at least 20 µm thick. As a result, an actuator based on such an electrostrictive EMP requires an input voltage of about 2000 volts. Such a voltage is typically not available in a mobile device.

Polyvinylidene difluoride (PVDF) and poly[(vinylidene-fluoride-co-trifluoroethylene (P(VDF-TrFE)) are well-known ferroelectric sensor materials. However, these materials suffer from low strain, and thus perform poorly for many applications, such as keys on a keyboard.

FIG. 1 illustrates the basics of an exemplary EMP actuator 100 creating mechanical motion in response to an electrical stimulation. As shown in FIG. 1, EMP actuator 100 includes EMP layer 102, which may be itself consists of a number of EMP layers, is bonded to substrate 103. Substrate layer 103 is made of a thin, flexible material that is not compliant the longitudinal direction. During a quiescent state, i.e., without an electrical potential imposed across EMP layer 102, EMP actuator 100 is unstressed (FIG. 1a). When a DC electrical potential (i.e., 0 Hz) is imposed across EMP layer 102, EMP layer 102 elongates. As substrate 102 is not sensitive to the electrical potential, a large mechanical stress causes EMP actuator 100 to buckle, as shown in FIG. 1(b). With a non-zero driving frequency, vibrations may be created at different frequencies.

One area that EMPs find application is haptics. In this context, the term "haptics" refers to tactile user input actions. In a conventional keyboard, the mechanical, spring-loaded action of a pressed key and the associated audio "click" are haptic responses to the touch typist that a key has been successfully depressed. Similarly, a haptics-enabled touch screen may generate an immediate haptic feedback vibration when the key is activated by user input. The feedback vibration makes the virtual element displayed on the touch screen more physical and more realistic. In a portable device (e.g., a mobile telephone), a haptic feedback action can reduce both user input errors and stress, allow a higher input speed, and enable new forms of bi-directionally interactions, Haptics is particularly effective for keyboards that are used in noisy or visually distracting environments (e.g., a battlefield or a gaming environment). Haptics can reduce input error rates and improve response speed.

Recently proposed high-definition (HD) haptics may provide significantly more tactile information to a user, such as texture, speed, weight, hardness, and damping. HD haptics uses frequencies that may be varied between 50 Hz to 400 Hz to convey complex information, and to provide a richer, more useful and more accurate haptic response. Over this frequency range, a user can distinguish feedback forces of different frequencies and amplitudes. The feedback vibration is expected to be controlled by software. For a user to experience a strong feedback sensation, HD haptics in this frequency range, switching times (i.e., rise and fall time) between frequencies of 40 milliseconds (ms) or less are required. The ability to provide such HD feedback vibrations in the 50 Hz to 400 Hz band, however, is not currently available. In the prior art, a typical device having basic haptics has an output magnitude that varies with the frequency of the driving signal. Specifically, the typical device provides a greater output magnitude at a higher frequency from the same input driving amplitude. For example, if a haptic driving signal includes two equal-magnitude sine waves at two distinct frequencies, the output vibration would be a superposition of two sine waves of different magnitudes, with the magnitudes being directly proportional to the respective frequencies. Such a haptic response is not satisfactory. Therefore, a compact, low-cost, low-driving voltage, and robust HD haptics actuation device is needed.

Haptic responses need not be limited to 50 Hz to 400 Hz vibrations. At lower frequency, a mechanical pressure response may be appropriate. Vibrations in the acoustic range can be made audible. A haptic response that can be delivered in more than one mode of sensation (e.g., mechanical pressure, vibration, or audible sound) is termed "multimodal."

Recently, the consumer electronics industry has been demanding very thin profile keyboards (e.g., 2-3 mm thick). For example, Microsoft Corporation introduced for its Surface tablet computer a keyboard which also serve as a protective cover of the tablet computer. FIG. 2 shows a side view of prior art thin profile keyboard 200. As shown in FIG. 2, keyboard 200 includes substrate or base layer 201, force-sensing resistor (FSR) layer 202 and cover layer 203. Base layer 201 provides protection and mechanical support for keyboard 200. FSR layer 202 is a sensing layer which is made of a material which resistance changes with an applied mechanical force on its surface (e.g., the pressure applied by a human finger, as illustrated in FIG. 2). Cover layer 203 provides protection to FSR layer 202. Cover layer 203 is thus made of a durable material. In addition, as the force of the user's finger is transmitted by cover layer 203 to FSR layer 202, cover layer 203 is made of a flexible material. Typically, base layer 201 is the most rigid layer of keyboard 200. However, without haptic feedback, such thin profile keyboards are not satisfactory to most users.

SUMMARY OF THE INVENTION

According to one embodiment of the present invention, electromechanical polymer (EMP) actuators are used to create haptic effects on a mobile device's mechanical interfaces (e.g., keys of a keyboard). In some embodiments, the keys of the keyboard are embossed in a top layer to provide better key definition and to house the EMP actuator. Specifically, an EMP actuator is housed inside an embossed graphic layer that covers a key of the keyboard. The present invention is of significant user interface value. For example, the embossed key provides the tactile effect of the presence of a key with edges, while allowing for the localized control of haptic vibrations. For such applications, an EMP transducer provides high strains, vibrations or both under control of an electric field. Furthermore, the EMP transducer can generate strong vibrations. When the frequency of the vibrations falls within the acoustic range, the EMP transducer can generate audible sound, thereby functioning as an audio speaker. Thus, the EMP actuator of the present invention can provide a multimodal haptic response (e.g., generating deformable surface, vibration, or audible sound, as appropriate). In addition, the EMP transducer can also serve as a touch sensor, as a mechanical pressure applied on the EMP transducer can induce a measurable electrical voltage output. Therefore, the EMP transducer may serve as both a sensor and an actuator.

The EMP layer is charged by the excitation signal. The excitation signal may have a frequency in a frequency range within the human acoustic range. In response to the excitation signal, the associated EMP actuator vibrates at substantially the frequency of the excitation signal. The frequency range may be between 0 Hz (i.e., DC) to 10,000 Hz, depending on the EMP actuator's application. When the EMP actuator is used to provide a haptic feedback, the frequency may be in the range of 50 Hz to 400 Hz; and when the EMP actuator is used to provide certain acoustic functions, the frequency can be in the range of 400 Hz to 10,000 Hz. The vibration of the EMP actuator may provide an audible sound. The EMP actuator disclosed herein may have a response latency relative to the excitation signal of less than 40 milliseconds. In addition, the EMP actuator may have a decay time of less than 40 milliseconds. The EMP layer may have an elastic modulus greater than 500 MPa at 25° C. and an electromechanical strain greater than 1%, when experiencing an electric field of greater than 100 MV/m.

Unlike current haptics system which typically vibrates the entire electrical device, which is often rigid, the EMP actuator-enabled haptics can vibrate directly under the point of contact (e.g., a user's finger). In one embodiment, an array or grid of EMP actuators are provided, in which only the actuator under the touch is selectively activated, thereby providing a "localized" haptics feedback. When the EMP actuators are arranged in sufficiently close vicinity of each other, the haptic system may take advantage of haptic responses that are superimposed for constructive interference. In some embodiments, the substrate may vibrate in concert with the EMP actuators.

When a specific key is pressed by a user, an excitation signal may be provided to cause the associated EMP actuator to vibrate, so as to confirm to the user that the user's typing action has been detected.

According to one embodiment of the present invention, the EMP actuator of the haptic system may be activated by a high frequency signal having one or more frequency components in the range of 400 Hz to 10,000 Hz. The high frequency vibration of the EMP actuator (or the EMP actuator together with the substrate) can generate an audible acoustic signal as a feedback response.

The present invention is better understood upon consideration of the detailed description below in conjunction with the accompanying drawings.

DETAILED DESCRIPTION OF THE PREFERRED EMBODIMENTS

According to one embodiment of the present invention, haptic feedback response is provided in a mechanical interface, such as a thin profile keyboard, using electromechanical polymer (EMP) actuators. Throughout this detailed description, keys on a keyboard are used to illustrate the present invention without an intention to so limit. In fact, the present invention is applicable to other mechanical interfaces at which a localized haptic response is desired.

Figure 2:
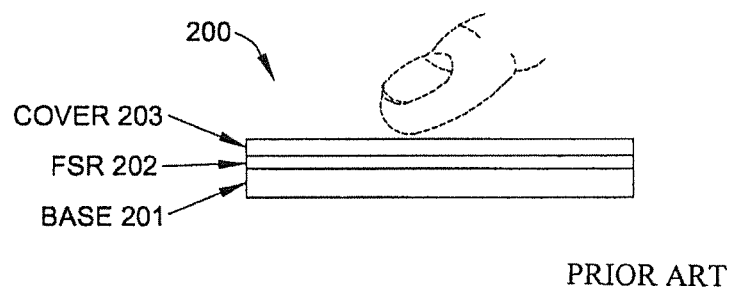
FIG. 2 shows a side view of prior art thin profile keyboard 200.
Figure 3:
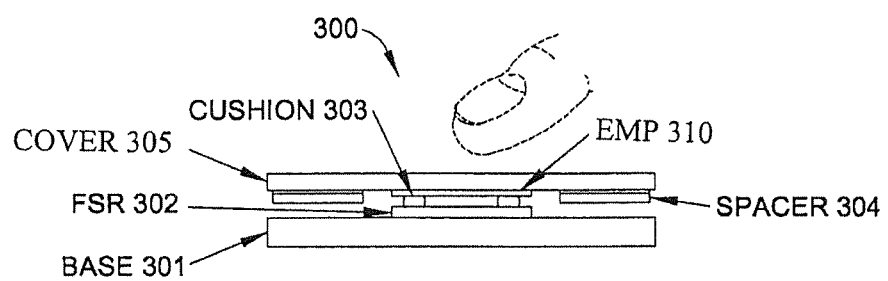
FIG. 3 shows a side view of keyboard 300 having an electromechanical polymer (EMP) actuator included with each key or surface, in accordance with one embodiment of the present invention.

FIG. 3 shows a side view of keyboard 300 having an EMP actuator included with each key or surface, in accordance with one embodiment of the present invention. As shown in FIG. 3, keyboard 300 includes base layer 301, force-sensing resistor (FSR) layer 302, spacer layer 304, including a number of cavities for accommodating numerous EMP actuators 310, and cover layer 305. EMP actuators 310 are attached to cover layer 305 and are each separated from FSR layer 302 by a cushion 303. Base layer 301 and FSR layer 302 perform like functions as base layer 201 and FSR layer 202 of FIG. 2. Specifically, base layer 301 provides protection and mechanical support for keyboard 300. FSR layer 302 is the sensing layer and is made of a material which resistance changes with an applied mechanical force on its surface (e.g., the pressure applied by a human finger, as illustrated in FIG. 3). EMP actuators 310 are each aligned vertically with an active sensing area of FSR layer 302 ("FSR sensor"). The portions of FSR layer 302 outside of the FSR sensors are inactive areas where support structures and wiring are provided. Spacer layer 304, having a thickness in the range of 0.2 mm to 0.5 mm, for example, is provided above the inactive areas of FSR layer 302. Cover layer 305, which is preferably made of a durable, flexible material, protects FSR layer 302 and transmits any force impressed, for example, by a user's finger, to FSR layer 302. When a user touches a key, the pressure of the touch is transmitted to the corresponding FSR sensor, which provides an electrical signal to a controller. In response, the controller activates the corresponding EMP actuator to provide a haptic feedback response.

Figure 4:
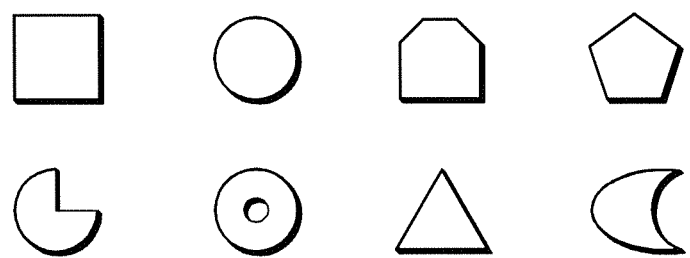
FIG. 4 shows some examples of the shapes of EMP actuators (e.g., EMP actuators 310) may be made into, as seen from above.
Figure 5:
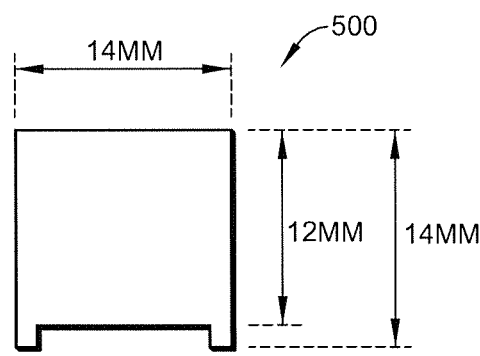
FIG. 5 shows EMP actuator 500, having a shape that is suitable for use in keys and surfaces.

As EMP actuators 310 are made from a polymer material, each of EMP actuators 310 may be made into any suitable shape. FIG. 4 shows some examples of the shapes EMP actuators 310 may be made into, as seen from above. In particular, FIG. 5 shows EMP actuator 500, which has a shape that is suitable for use in keys and surfaces. As shown in FIG. 5, EMP actuator 500 has a footprint that is, for example, 14 mm by 14 mm, including a 14 mm by 12 mm active area. An exemplary capacitance for EMP actuator 500 may be about 250 nanofarad of capacitance. As EMP actuators 310 are attached to the back side of cover layer 305, cover layer 305 together with the EMP actuators 310 create a vibration structure. That is, an additional passive layer (e.g., substrate layer 103 of FIG. 1) is not necessary for creating a vibration structure. When an EMP actuator is actuated, its vibration is transmitted through cover layer 305 to provide the haptic feedback to the user.

Figure 6:
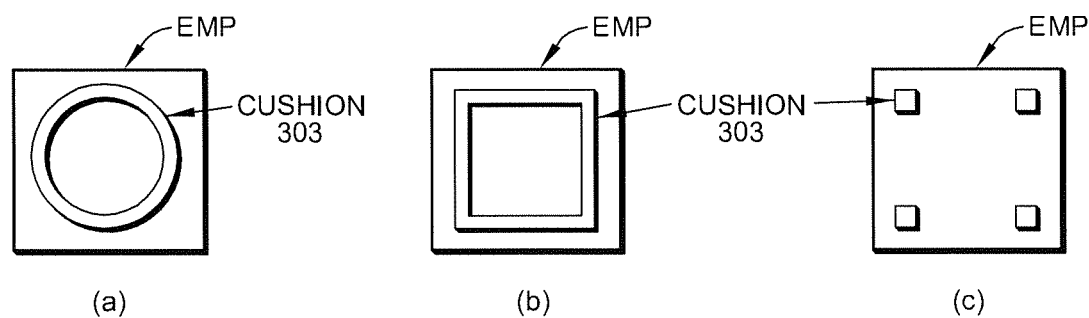
FIG. 6 shows some exemplary cushion shapes, in accordance with one embodiment of the present invention.

As seen from FIG. 3, cushion 303 is provided between each of EMP actuators 310 and the corresponding FSR sensor. The thickness of the cushions are specifically designed to be slightly less than the distance between the EMP actuator on which it is attached and the corresponding active area of FSR layer 302, so as to avoid imposing a force on the FSR sensor when there is no force on the corresponding area of cover layer 305. The cushion reduces attenuation of the haptic feedback when a user pushes hard on a key. A properly designed cushion reduces the attenuation of the haptic feedback response. FIG. 6 shows some exemplary cushion shapes, in accordance with one embodiment of the present invention. As shown in FIG. 6, examples (a)-(b) are in the forms of circular or rectangular cylinders with an annular 1 mm thick cross sections, and example (c) has four posts each with a rectangular cross section of about 1 mm in width or breadth. Each cushion may preferably have a hardness between 20 A to 30 A. The internal diameter of example (a) is preferably roughly 10 mm.

Figure 7:
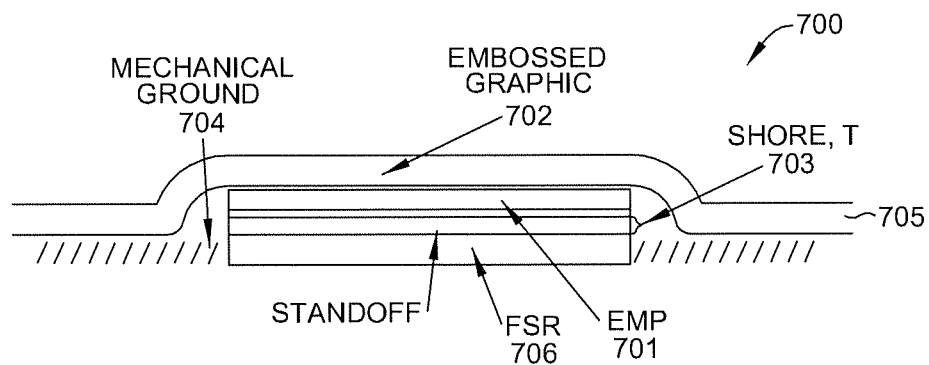
FIG. 7 shows schematically embossed key 700 of a keyboard in which EMP actuator 701 is attached to the embossed area 702 of cover layer 705, in accordance with one embodiment of the present invention.

According to one embodiment of the present invention, the EMP actuator is attached to a raised or embossed area of the cover layer. Such an embossing structure may increase the strength of the haptic feedback by an EMP actuator. FIG. 7 shows schematically embossed key 700 of a keyboard in which EMP transducer 701 is attached to the embossed area 702 of cover layer 705, in accordance with one embodiment of the present invention. As shown in FIG. 7, embossed key 700 includes EMP transducer 701, which is attached to embossed area 702, standoff or cushion 703, and FSR sensor 706 embedded in mechanical ground 704. In FIG. 7, mechanical ground 704 embeds FSR sensor 706; however, other thin film type sensors underneath standoffs. Cushion 703 may have any of the forms shown in FIG. 8 (i.e., annular with a circular cross section, in two parallel strips, in four cubes, annular with a rectangular cross section) or may be provided as a solid piece. Alternatively, EMP transducer 701 may serve as both an actuator and an electromechanical sensor. Standoff or cushion 703 limits the distance of mechanical travel between EMP transducer 701 and mechanical ground 704 when embossed key 700 is loaded by a user's finger. The thickness (t) of standoff 703 determines the distance of mechanical travel experienced by embossed key 700 when loaded by a user's finger. Therefore, the thickness allows for tuning of the mechanical travel. Furthermore, when the user presses on embossed key 700, standoff 703 captures the pressure on EMP transducer 701, such that the haptic vibration is not significantly damped. The height of the embossing may be around 0.20.4 mm, for example.

Figure 8:
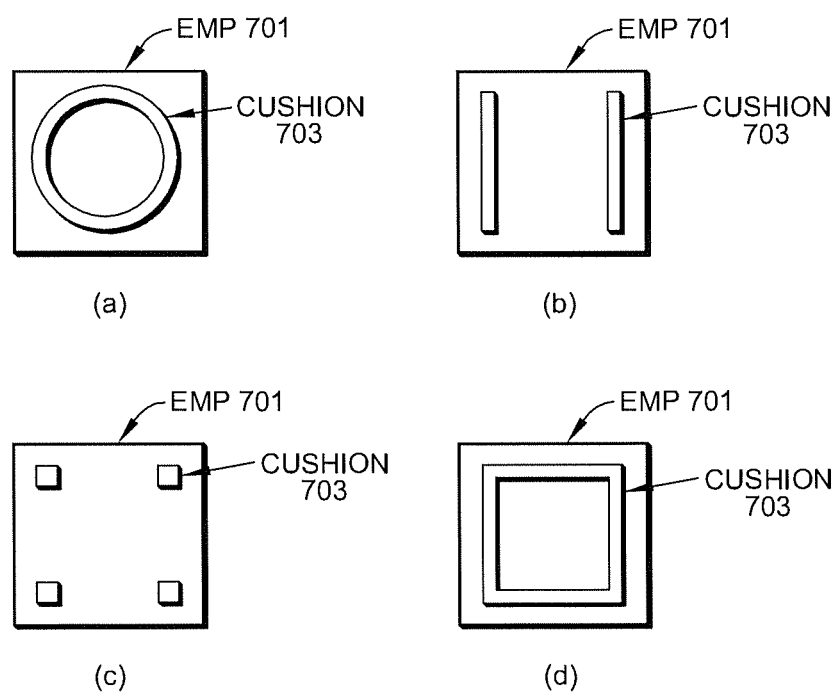
FIG. 8 shows four types of standoffs that can be used in conjunction with embossed key 700.

The haptic response can be isolated to the embossed structure (i.e., embossed key 700) only, thus enforcing the ability to provide a localized haptics response to only the key of interest. In this way, haptic vibrations occurring at a key of interest are not felt at a neighboring key. Thus, embossed key 700 has the advantage of incorporating both the kinesthetic presence of a geometrically defined key, as well as providing a haptic vibration response, without unduly adding to the thickness of the key. FIG. 8 shows four types of standoffs that can be used in embossed key 700. Standoff 703 transfers force from the embossing structure to the thin film force sensor, and does not significantly attenuate vibration from the EMP sensor. EMP transducer 701 may vibrate at different frequencies or at different amplitudes under different conditions.

An embossed key is much more clearly defined to the user, facilitating the user's determination of the exact location of the key with his/her tactile feeling. In addition, the haptic feedback response (e.g., vibration) is much stronger in the embossed structure.

Figure 9A:
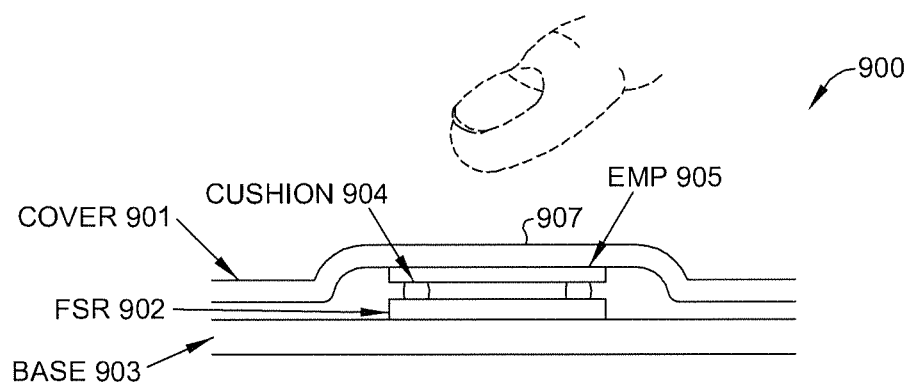
FIG. 9(a) shows embossed key 900, according to another embodiment of the present invention.
Figure 9B:
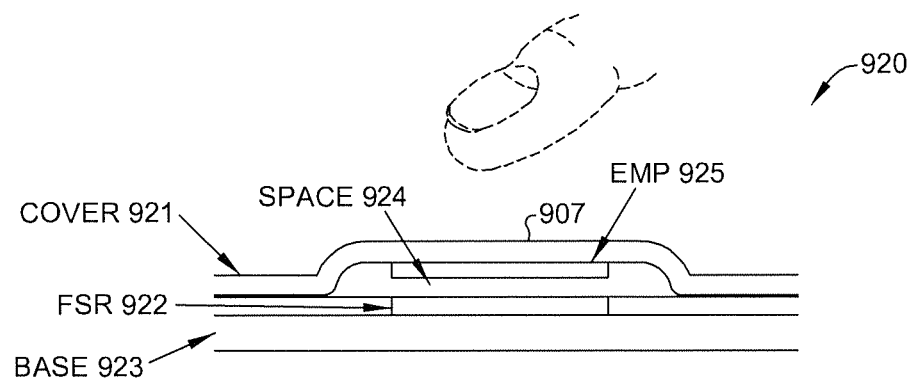
FIG. 9(b) shows embossed key 920, according to another embodiment of the present invention.

FIG. 9(a) shows embossed key 900, according to another embodiment of the present invention. As shown in FIG. 9(a), EMP actuator 905 is attached to an underside of an embossed area 907 of cover layer 901 of embossed key 900 in a thin profile keyboard. EMP actuator 902 is separated by cushion 904 from FSR sensor 905 which is embedded in a FSR layer provided above substrate or base 903. Alternatively, as shown in FIG. 9(b), some embodiments need not include a physical cushion structure underneath the EMP layer. Thus, FIG. 9(b) shows embossed key 920, according to another embodiment of the present invention. As shown in FIG. 9(b), EMP actuator 925 is attached to an underside of an embossed area 907 of cover layer 921 of embossed key 920 in a thin profile keyboard. Rather than by a cushion, EMP actuator 925 is separated by air gap or space 924 from FSR sensor 922, which is embedded in a FSR layer provided above substrate or base 923. In still other embodiments, neither cushion 904 nor space 924 is provided, i.e., the EMP actuator of the EMP actuator directly contacts an FSR sensor. Such an embodiment may provide a keyboard of even thinner profile.

Figure 10A:
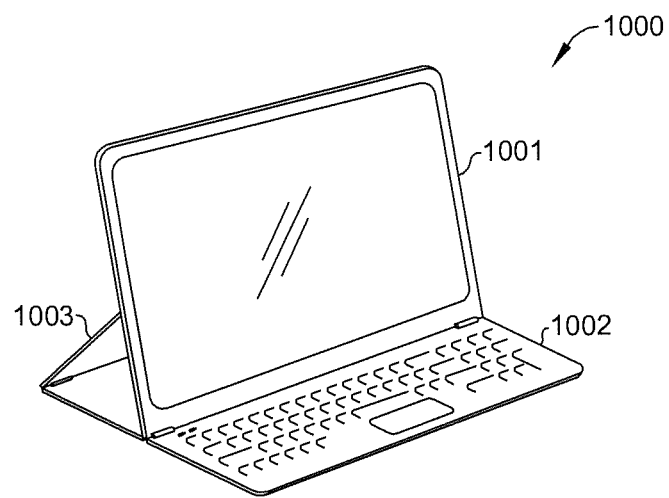
FIGS. 10(a), (b) and (c) show different configurations of mobile computer 1000, which includes 2-sided keyboard 1002 and cover/stand 1003, in accordance with one embodiment of the present invention.
Figure 10B:
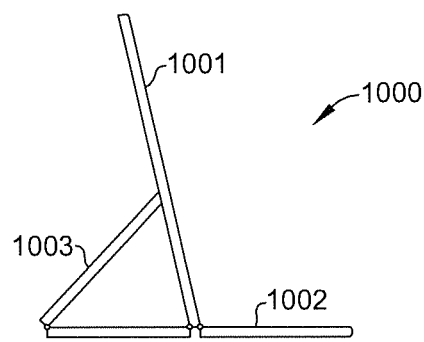
Figure 10C:
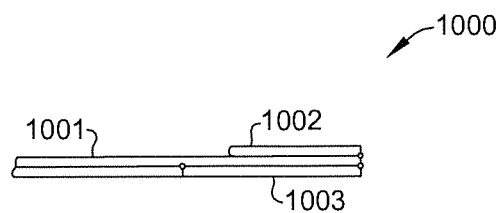

Because of their thin profiles, the keyboards of the present invention may be used with many types of mobile devices, such as tablet computers. Such a keyboard may be used for other functions also (e.g., protective covering). FIGS. 10(a), (b) and (c) show different configurations of mobile computer 1000, which includes 2-sided keyboard 1002, in accordance with one embodiment of the present invention. As shown in these figures, mobile computer 1000 includes tablet device 1001, 2-sided keyboard 1002 and protective cover 1003. Protective layer 1003 and 2-sided keyboard 1002 are attached along one side of table device 1001. Protective cover 1003 may be folded in such a way to serve as a stand to prop up tablet device 1001 in the manner shown in FIGS. 10(a) and 10(b). In these configurations, protective cover 1003 serves as a stand for tablet device 1001. To serve in this function, protective cover 1003 may be provided a crease or is hinged to allow it to be folded into a stand. 2-sided keyboard 1002 is a thin pad that has keys of the present invention provided on both sides, such that each side can be used by itself as an independent keyboard. In the configurations of FIGS. 10(a) and 10(b), the user can view the entire surface of tablet device 1001 at a favorable angle. Either side of 2-sided keyboard 1002 may be used for input purpose. In FIG. 10(c), protective cover 1003 is configured to lay flat against tablet device 1001 to provide protection on the back side, while 2-sided keyboard 1002 is rests flat against a lower half surface of tablet device 1001. In this configuration, a portion of tablet device 1001 is covered by 2-sided keyboard 1002. However, mobile computer 1000 may be used in the conventional tablet fashion, allowing data input to be made through the keys of 2-sided keyboard 1002 on the side facing away from the display surface of tablet device 1001.

The electromechanical polymer (EMP) transducers suitable for the present invention disclosed herein are numerous, including ferroelectric, dielectric elastomer, piezoelectric and electro-restrictive materials.

Some examples of the electromechanically active polymers incorporated in the EMP transducers of the present invention include P(VDF-TrFE) modified by either high energy density electron irradiation or by copolymerization with a third monomer. Under such a modification, the EMP loses its piezoelectric and ferroelectric behaviors and become an "electrostrictive" or "relaxor ferroelectric" material.

An electromechanical polymer (EMP) transducer typically includes a large number of EMP active layers (e.g., 1-1000 or more layers) and electrodes bonded to each layer thereto. The EMP active layers may be configured as a stack, bonded to each other by an adhesive or by thermal lamination, for example, to achieve a cumulative force effect. The electrodes may be arranged to connect multiple active layers in parallel. With the EMP active layer each being less than 10 microns thick, the EMP actuators may be actuated at a low driving voltage (e.g., 300 volts or less; preferably, 150 volts or less) suitable to be powered by a wide variety of consumer electronic devices, such as mobile telephones, laptops, ultrabooks, and tablets.

EMP layers of a EMP transducers used in the present invention may be preprocessed (e.g., uniaxially or biaxially stretched, conventionally or otherwise, or having electrodes formed thereon) to condition the EMP layer's electromechanical response to an applied external field. A biaxially stretched actuator can deform in all directions in the plane of the axes of stretching. When the FSR layer of a key signals that the key is pressed by a user, an excitation signal is provided by the keyboard controller to cause the associated EMP actuator to vibrate, as a haptics response to confirm to the user that the user's typing action has been detected.

The electrodes of any EMP transducers discussed herein may be formed using any suitable electrically conductive materials, such as transparent conducting materials (e.g., indium tin oxide (ITO) or transparent conducting composites, such as indium tin oxide nanoparticles embedded in a polymer matrix). Other suitable conductive materials include carbon nanotubes, graphenes, and conducting polymers. The electrodes may also be formed by vacuum deposition or sputtering using metals and metal alloys (e.g., aluminum, silver, gold, or platinum). Nanowires that are not visible over a graphical display layer may also be used, such as silver nanowires, copper nanowires, and alloy nanowires with diameter less than 100 nm.

The present invention may be used to provide keyboards or other user interface devices in consumer electronics, which continue to become smaller and thinner. Low-profile, thin keyboards are desired for use with many information processing devices (e.g. tablet computers, ultrabook and MacBook Air). Because the EMP transducers of the present invention can be made very thin, according to one embodiment of the present invention, a keyboard based on EMP transducers may be provided which includes physical key movements in the manner of a conventional keyboard.

A haptic response may be provided as confirmation of receipt of the user's key activation in the user's typing. In this regard, the EMP actuators may replace the spring mechanism in a classical keyboard, enabling a low-profile thin keyboard, while still providing the desirable key travel distance in a conventional keyboard that a user expects.

The EMP transducer can also serve as a force or pressure sensor by itself. Pressing an EMP transducer generates a voltage across the transducer, which may be used in lieu of a conventional force transducer (e.g., the FSR sensor). In other words, the EMP transducer may serve as both the actuator and the sensor without requiring an additional conventional transducer.

The EMPs suitable for use in components (e.g., EMP actuators employed in haptic substrates and haptic devices disclosed herein) typically show very high strain of about 1% or more under an electric field gradient of 100 megavolts per meter or greater. (Strain is measured as the change in length of an EMP layer as a percentage of the quiescent length.) The EMP layers also may show elastic modulus of about 500 MPa or more at 25° C., a mechanical vibrational energy density of 0.1 $J/cm^3$ or more, a dielectric loss of about 5% or less, a dielectric constant of about 20 or more, an operating temperature of about −20° C. to about 50° C., and a response time of less than about 40 millisecond.

Suitable electrostrictive polymers for EMP layers 140 include irradiated copolymers and semi-crystalline terpolymers, such as those disclosed in U.S. Pat. Nos. 6,423,412, 6,605,246, and 6,787,238. Suitable irradiated copolymers may include high energy electron irradiated $P(VDF_x\text{-}TrFE_{1-x})$ copolymers, where the value of x may vary between 0.5 to 0.75. Other suitable copolymers may include copolymers of $P(VDF_{1-x}\text{-}CTFE_x)$ or $P(VDF_{1-x}\text{-}HFP_x)$, where the value of x is in the range between 0.03 and 0.15 (in molar). Suitable terpolymers that may have the general form of $P(VDF_x\text{-}2nd\ monomer_y\text{-}3rd\ monomer_{1-x-y})$, where the value of x may be in the range between 0.5 and 0.75, and the value of y may be in the range between 0.2 and 0.45. Other suitable terpolymers may include $P(VDF_x\text{-}TrFE_y\text{-}CFE_{1-x-y})$ (VDF: vinylidene fluoride, CFE: chlorofluoroethylene, where x and y are monomer content in molar), $P(VDF_x\text{-}TrFE_y\text{-}CTFE_{1-x-y})$ (CTFE: chlorotrifluoroethylene), poly(vinylidene fluoride-trifluoroethylene-vinylidene chloride)(P (VDF-TrFE-VC)), where x and y are as above; poly (vinylidene fluoride-tetrafluoroethylene-chlorotrifluoroethylene)(P(VDF-TFE-CTFE)), poly (vinylidene fluoride-trifluoroethylene-hexafluoropropylene), poly(vinylidene fluoride-tetrafluoroethylene-hexafluoropropylene), poly(vinylidene fluoride trifluoroethylene-tetrafluoroethylene), poly(vinylidene fluoride tetrafluoroethylene tetrafluoroethylene), poly(vinylidene fluoride-tri fluoroethylene-vinyl fluoride), poly(vinylideneflouride-tetrafluoroethylene-vinyl fluoride), poly(vinylidene fluoride-trifluoroethyl eneperfluoro(methyl vinyl ether)), poly(vinylidene fluoride-tetrafluoroethylene-perfluoro (methyl vinyl ether)), poly(vinylidene fluoride-trifluoroethylene-bromotrifluoroethylene, polyvinylidene), poly(vinylidene fluoride-tetrafluoroethylene-chlorofluoroethylene), poly(vinylidene fluoride-trifluoroethylene-vinylidene chloride), and poly(vinylidene fluoride tetrafluoroethylene vinylidene chloride), Furthermore, a suitable EMP may be in the form of a polymer blend. Examples of polymer blends include of polymer blends of the terpolymer described above with any other polymers. One example includes the blend of P(VDF-TrFE-CFE) with P(VDF-TrFE) or blend of P(VDF-TrFE-CTFE) with P(VDF-TrFE). Other examples of suitable polymer blends include a blend of P(VDF-TrFE-CFE) with PVDF or a blend of P(VDF-TrFE-CTFE) with PVDF. Irradiated P(VDF-TrFE) EMP may be prepared using polymeric material that is itself already a polymer blend before irradiation.

Figure 1:
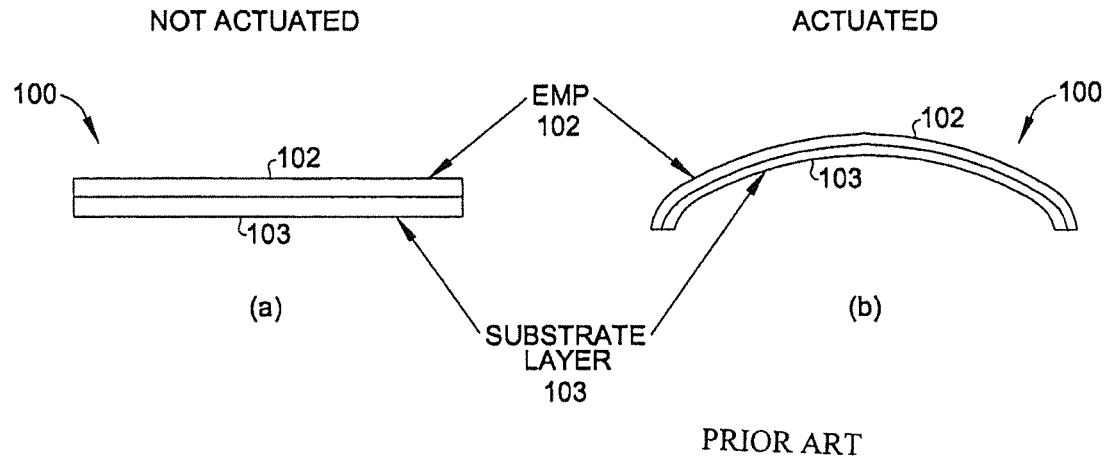
FIG. 1 illustrates the basics of an EMP actuator creating mechanical motion in response to an electrical stimulation.

According to one embodiment of the present invention, to form a EMP layer, P (VDF-TrFE-CFE) polymer powder was dissolved in N, N-dimethylformamide (DMF) solvent at 5 wt. % concentration. The solution was then filtered and cast onto a glass slide to produce a 30 μm thick film. The film was then uniaxially stretched by 700% (i.e., the final film length equals to 700% of the cast film length), resulting in 5 μm thick film. The stretched 5 μm thick film was further annealed in a forced air oven at 110° C. for two hours. FIG. 1 shows storage modulus of the resulting stretched film, as measured using a dynamic mechanical analyzer (e.g., DMA, TA DMA 2980 instrument) at 1 Hz over a temperature range of −20° C. to 50° C. The stretched polymer film may have a storage modulus of 685.2 MPa at 25° C. Thus, an EMP actuator may be made by casting a layer of EMP polymer (e.g., a P(VDF-TrFE-CFE) or P(VDF-TrFE-CTFE) terpolymer).

The stretched EMP film may be metallized by sputtering gold on both sides of the film. Various voltages were applied to the resulting EMP actuator and the changes in film length in the direction parallel to stretching were measured. The stretched EMP film has strain $S_1$ of 0.48% at 40 MV/m and 2.1% at 100 MV/m.

Table 1 shows the performance of actuators made with modified, P(VDF-TrFE)-based EMP ('EMP"), dielectric elastomer and piezoceramics.

| Property | EMP | Elastomer DEAP | Piezoceramics (PZT 5H) |
|---|---|---|---|
| Strain (Stretching Direction) | 2.0% at 100 V/μm | 5-10% at 100 V/μm | 0.1% at 2 V/μm |
| Young's Modulus (MPa) | >500 | ~1 | ~100,000 |
| Vibration Mechanical Energy Density (J/cm³) | >0.1 | ~0.005 | ~0.05 |
| Dielectric Constant | 35 | 3 | 2500 |
| Dielectric Loss (%) | 5 | 5 | 2 |
| Minimal Film Thickness (μm) | 3 | 18 | 50 |
| Voltage for Listed Strain | 300 | 1800 | 100 |
| Operating Temperature | −20° C.~ 50° C. | −20° C.~ 50° C. | −50° C.~ 100° C. |
| Response Time (ms) | <1 | <10 | <0.1 |

As shown in Table 1, an EMP layer made with modified, P(VDF-TrFE)-based EMP has balanced electromechanical response and mechanical modulus. The output vibration mechanical energy density of such an EMP layer is also significantly higher than the elastomer DEAP and piezoceramic actuators.

Each EMP actuator may be actuated independently or in concert with other EMP actuators. As explained below, the EMP actuators may excite structural modes of the haptic surface within a desired haptic frequency band. Also, the EMP actuators may be arranged to operate as a phased array to focus haptic feedback to a desired location. In one embodiment, the EMP actuators may be laminated on a thin glass or plastic substrate that is less than 1,000 μm thick. Such a haptic surface is sufficiently thin to effectively transmit a haptic event without significantly attenuating the actuator output. Suitable substrate materials include transparent materials such as glass, polycarbonate, polyethylene terephthalate (PET), polymethyl methacrylate, polyethylene naphthalate (PEN), opaque material such as molded plastic, or mixtures thereof. Other suitable substrate materials include multi-component functional sheets such LCD, OLED, PET and combinations thereof.

EMP actuators disclosed herein may be actuated by low driving voltages of less than about 300 volts (e.g., less than about 150 volts). These driving voltages typically may generate an electric field of about 40 V/μm or more in the EMP layer of the EMP actuator. The EMP actuators may be driven by a voltage sufficient to generate an electric field that has a DC offset voltage of greater than about 10 V/μm, with an alternating component of peak-to-peak voltage of less than 300 volts. (The excitation signal need not be single-frequency; in fact, an excitation signal consisting simultaneously of two or more distinct frequencies may be provided.) The EMP actuators disclosed herein provide a haptic vibration of substantially the same frequency of frequencies as the driving voltage. When the driving voltages are in the audio range (e.g., up to 40,000 Hz, preferably 400-10000 Hz), audible sounds of substantially those in the driving frequency or frequencies may be generated. These EMP actuators are capable of switching between frequencies within about 40 ms, and are thus suitable for use in HD haptics and audio speaker applications. The EMP actuators are flexible and can undergo significant movement to generate high electrostrictive strains. Typically, a surface deformation application would use excitation frequencies in the range between 0-50 Hz, a localized haptic application would use excitation frequencies in the range between 50-400 Hz, and an audio application would use excitation frequencies in the range between 400-10,000 Hz, for example.

When driven under an AC signal, the waveform may be triangular, sinusoid, or any arbitrary waveform. In fact, the waveform can be customized to generate any specific, desired tactile feedback. For example, the frequency of the waveform can be the same throughout the duration of a haptics event, or may be continuously changed. The waveform or the amplitude of the AC signal can also be the same throughout the haptics event, or continuously changed.

The EMP actuators disclosed herein may have latency rise time (i.e., the time between the EMP actuator receiving its activating input signal to the EMP actuator providing the mechanical haptic response) from less than about 5 milliseconds up to about 40 milliseconds. The EMP actuators may have a decay time (i.e., the time between the EMP actuator receiving the cessation of the activating input signal to the EMP actuator's haptic response falling below the user's detectable threshold) from less than about 5 milliseconds up to about 40 milliseconds. The EMP actuators may have an acceleration response of greater than about 0.5 G to about 2.5 G over a frequency range of about 100 Hz to about 300 Hz.

The above detailed description is provided to illustrate the specific embodiments of the present invention and is not intended to be limiting. Numerous variations and modifications within the scope of the present invention are possible. The present invention is set forth in the following claims.

We claim:

1. A two-sided keyboard comprising a first surface and a second surface on opposite sides of the two-sided keyboard, wherein each of said first and second surfaces include:
   a force-sensing layer including one or more force-sensing sensors to detect an application of a mechanical force;
   one or more electromechanical polymer (EMP) transducers to provide a localized vibration in response to receiving a signal, corresponding to the detected mechanical force, to activate the one or more EMP transducers, wherein a mode of response is determined based in part on an amplitude of the localized vibration;
a cushion with a thickness selected to control the amplitude of the localized vibration, the thickness of the entirety of the cushion being less than a distance between the one or more EMP transducers and the force sensing layer; and
a covering layer covering the force-sensing layer and the EMP transducers, wherein the EMP transducers are directly attached to an underside of the covering layer such that the localized vibration is transmitted to the covering layer without going through an intervening passive layer.

2. The two-sided keyboard of claim 1, wherein each of said first and second surfaces include the cushion attached to each EMP transducer between the EMP transducer and a corresponding one of the force-sensing sensors to which the EMP transducer is aligned, wherein the cushion has a hardness between 20 A- 30 A.

3. The two-sided keyboard of claim 1, wherein the force-sensing sensors comprise a force-sensing resistor material.

4. The two-sided keyboard of claim 1, further comprising a spacer layer provided between the covering layer and the force-sensing layer, wherein the spacer layer has one or more cavities each aligned with one of the force-sensing sensors, so as to accommodate a corresponding one of the EMP transducers.

5. The two-sided keyboard of claim 1, wherein between the one or more EMP transducers and the force-sensing layer is provided an air gap.

6. The two-sided keyboard of claim 1, wherein each of the first surface and the second surface can be used independently as an input device.

7. The two-sided keyboard of claim 1, wherein the two-sided keyboard is attached to a tablet computer.

8. The two-sided keyboard of claim 7, wherein the both of the first surface and the second surface are used simultaneously for input to the tablet computer.

9. The two-sided keyboard of claim 7, wherein the first surface and the second surface are used to cover the tablet computer.

10. The two-sided keyboard of claim 7, wherein tablet computer has a display and wherein the first surface faces the display, and the second surface faces away from the display, and wherein the second surface can be used to provide input to the tablet computer.

11. A portable computing device comprising:
a tablet computer having a first side, a second side, and a controller; and
a two-sided keyboard having a first surface and a second surface provided to cover the second side of the tablet computer, the two-sided keyboard having (i) a first configuration wherein, the first surface of the two-sided keyboard is opened up for data input, and (ii) a second configuration wherein the two-sided keyboard rests flat against the second side of the tablet computer and provides the second surface of the two-sided keyboard for data input, wherein each surface of the two-sided keyboard comprises:
a force-sensing layer including one or more force-sensing sensors to detect application of a mechanical force;
one or more electromechanical polymer (EMP) transducers to provide a localized vibration in response to receiving a signal, corresponding to the detected mechanical force, to activate the one or more EMP transducers, wherein a mode of response is determined based in part on an amplitude of the localized vibration;
a cushion with a thickness selected to control the amplitude of the localized vibration, the thickness of the entirety of the cushion being less than a distance between the one or more EMP transducers and the force sensing layer;
a covering layer covering the force-sensing layer and the EMP transducers wherein the EMP transducers are directly attached to an underside of the covering layer such that the localized vibration is transmitted to the covering layer without going through an intervening passive layer.

12. The portable computing device of claim 11, wherein each of said first and second surfaces of the two-sided keyboard include the cushion attached to each EMP transducer between the EMP transducer and a corresponding one of the force-sensing sensors to which the EMP transducer is aligned, wherein the cushion has a hardness between 20 A- 30 A.

13. The two-sided keyboard of claim 11, wherein the force-sensing sensors comprise a force-sensing resistor material.

14. The portable computing device of claim 11, wherein the two-sided keyboard further comprising a spacer layer provided between the covering layer and the force-sensing layer, wherein the spacer layer has one or more cavities each aligned with one of the force-sensing sensors, so as to accommodate a corresponding one of the EMP transducers.

15. The portable computing device of claim 11, wherein between the one or more EMP transducers and the force-sensing layer is provided an air gap.

16. The portable computing device of claim 11, wherein the both of the first surface and the second surface are used simultaneously for input to the tablet computer.

17. The portable computing device of claim 11, further comprising a protective covering provided to cover the first side of the tablet computer, wherein the protective covering is configured to be folded to serve as a stand for propping up the tablet computer, and wherein only the first surface of the two-sided keyboard is used for input to the tablet computer.

18. A two-sided keyboard, the two-sided keyboard comprising:
a first surface comprising:
a first force-sensing layer including one or more first force-sensing sensors to detect application of a mechanical force;
a first set of electromechanical polymer (EMP) transducers to provide a localized vibration in response to receiving a signal, corresponding to the mechanical force detected by the first force-sensing layer, to activate the first set of EMP transducers, wherein a mode of response is determined based in part on an amplitude of the localized vibration;
a cushion with a thickness selected to control the amplitude of the localized vibration, the thickness of the entirety of the cushion being less than a distance between the first set of EMP transducers and the force sensing layer;
a covering layer covering the first force-sensing layer and the first set of EMP transducers; and
a second surface on a side opposite of the first surface, the second surface comprising:
a second force-sensing layer including one or more second force-sensing sensors to detect application of a mechanical force; and a second set of electromechanical polymer (EMP) transducers to provide a localized vibration in response to receiving a signal, corresponding to the mechanical force detected by the second force-sensing layer, to activate the second set of EMP transducers.

19. The two-sided keyboard of claim 18, wherein each of said first and second surfaces include the cushion with a hardness between 20 A- 30 A.

20. The two-sided keyboard of claim 18, wherein the both of the first surface and the second surface are used simultaneously for input to the tablet compute computer.

* * * * *